(12) United States Patent
Van Schaijk et al.

(10) Patent No.: US 6,991,982 B2
(45) Date of Patent: Jan. 31, 2006

(54) METHOD OF MANUFACTURING A SEMICONDUCTOR NON-VOLATILE MEMORY

(75) Inventors: Robertus Theodorus Fransiscus Van Schaijk, Leuven (BE); Michiel Slotboom, Leuven (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/514,022

(22) PCT Filed: May 5, 2003

(86) PCT No.: PCT/IB03/01740

§ 371 (c)(1),
(2), (4) Date: Nov. 6, 2004

(87) PCT Pub. No.: WO03/096413

PCT Pub. Date: Nov. 20, 2003

(65) Prior Publication Data

US 2005/0207209 A1    Sep. 22, 2005

(30) Foreign Application Priority Data

May 7, 2002    (EP) ................................. 02076830

(51) Int. Cl.
*H01L 21/336* (2006.01)
(52) U.S. Cl. ...................................... 438/257; 438/353
(58) Field of Classification Search ................ 438/257, 438/266, 294, 301, 353, 376, 377
See application file for complete search history.

(56) References Cited

U.S. PATENT DOCUMENTS

| 6,063,702 A | * | 5/2000 | Chung ........................ 438/624 |
| 6,551,890 B2 | * | 4/2003 | Dekker et al. ............... 438/329 |
| 6,724,093 B2 | * | 4/2004 | Cutter ........................ 257/788 |

* cited by examiner

*Primary Examiner*—Phuc T. Dang
(74) *Attorney, Agent, or Firm*—Peter Zawilski (57) ABSTRACT

A method of manufacturing a semiconductor device comprising a non-volatile memory with memory transistors and selection transistors. In this method a semiconductor body is provided with strip-shaped active regions (4) which are mutually isolated by field-oxide regions (3 of 4). On the surface (2) a first system of conductors 11 is then formed which are directed perpendicularly to the active regions and are covered by an insulating layer (12), charge storage regions (13) being formed below these conductors, at the location where these conductors and the active regions cross each other. These conductors form word lines of the memory and, at the location where said conductors and the active regions cross each other, they form control gates. Next, a conductive layer (16) is deposited and planarized. The planarized conductive layer (16) is then provided with an etch mask with strips directed perpendicularly to the active regions, which strips extend above and next to the conductors (11). Then a second system of conductors (19) is etched in the planarized conductive layer. The planarized layer here covers the conductors (11) with the insulating top layer (12) completely, so that the conductors (19) of the second system extend above the conductors (11) of the first system. Thus a very compact memory can be produced, enabling data written in the memory to be read out in very short times.

6 Claims, 8 Drawing Sheets

METHOD OF MANUFACTURING A SEMICONDUCTOR NON-VOLATILE MEMORY

The invention relates to a method of manufacturing a semiconductor device comprising a non-volatile memory with memory cells comprising a memory transistor and a selection transistor, in which method parallel, strip-shaped active regions which are mutually isolated by field oxide are formed in a semiconductor body so as to border on a surface thereof, after which the surface is provided with a first system of conductor tracks which are covered with an insulating layer and directed transversely to the active regions, which conductor tracks serve as control gates of memory transistors at the location where the conductor tracks and the active regions cross each other, and below which conductor tracks, at the location where the conductor tracks and the active regions cross each other, charge storage zones of these transistors are formed, whereafter a layer of conductive material is deposited which is subsequently subjected to a planarization treatment, after which the flat conductive layer thus formed is provided with an etch mask with strips directed transversely to the active regions and extending to above, and directly next to, the conductor tracks of the first system, after which the flat, conductive layer is anisotropically etched in accordance with a pattern, a second system of conductor tracks directed transversely to the active regions being formed which serve as a selection gate of selection transistors at the location where the conductor tracks and the active regions cross each other.

The conductor tracks of the first system of conductor tracks forming control gates of the memory transistors at the location where said conductor tracks and the active regions cross each other further serve as word lines of the memory, and the conductor tracks of the second system forming selection gates of the selection transistors at the location where said conductor tracks and the active regions cross each other further serve as selection lines of the memory. The charge storage zones below the control gates can be formed by floating gates but also by isolating layers, charge-trapping centers being present in their interface layer.

WO 01/67517 A1 discloses a method of the type mentioned in the opening paragraph, in which the planarization treatment performed on the layer of conductive material deposited on and between the conductor tracks of the first system of conductor tracks of conductive material is continued until the conductor tracks of the first system are exposed. In this manner, a structure is formed having a flat surface bordered by the conductor tracks of the first system and the parts of the layer of conductive material remaining between these conductor tracks. Subsequently, the flat conductive layer present between the conductor tracks of the first system is etched in accordance with a pattern. In this process, conductor tracks of the second system are formed. These conductor tracks are just as high as those of the first system.

In the known method, the flat conductive layer is etched in accordance with a pattern by means of an etch mask of photoresist having strips directed transversely to the active regions and extending above and directly next to the conductor tracks of the first system. To produce memory cells that are as small as possible, the width of the strips of the etch mask must be as small as possible, said width being determined by the available photolithographic equipment. When such an etch mask is provided, alignment tolerances must be taken into account, as a result of which the strips of the etch mask extend above as well as directly next to the conductor tracks of the first system. As a result, the etched conductor tracks of the second system of conductor tracks will be narrower than said minimum width. In practice, the conductor tracks of the second system will not be much wider than half of said minimum width. Consequently, the conductor tracks of the second system, serving as selection lines in the memory, will exhibit a comparatively high electric resistance. This leads to long RC times so that information stored in the memory can be read out relatively slowly only in practice. Wider conductor tracks could offer a solution, but would lead to larger memory cells. A lower electric resistance can also be obtained by providing the conductor tracks with a top layer of a properly conductive silicide. In view of the very small width of the tracks, this would cause the electric resistance to remain comparatively high.

It is an object of the invention to provide a method which enables a non-volatile memory with very compact memory cells to be obtained, in which information stored in the memory can be read comparatively rapidly.

To achieve this, the method is characterized in accordance with the invention in that the conductive layer is deposited in a thickness such that the planarization treatment results in a flat layer which completely covers the insulating layer present on the conductor tracks of the first system of conductor tracks, so that by etching the flat, conductive layer a second system of conductor tracks is formed which extend to above the conductor tracks of the first system. The planarization treatment can be stopped before the insulating layer on the conductor tracks of the first system is exposed, or the planarization treatment can be stopped when this insulating layer is exposed, after which an additional layer of the conductive material is deposited. In either case, a flat conductive layer is formed which completely covers the conductor tracks of the first system covered with an insulating layer. The etch mask used is the same as that employed in the aforesaid known method because, also in this case, alignment tolerances have to be taken into account. In this case too, the strips of the mask extend to above the conductor tracks of the first system of conductor tracks, so that the tracks of the second system of conductor tracks have a width at their upper side which is practically equal to that of the strips of the etch mask. As the conductor tracks of the second system partly overlap those of the first system, their width next to the tracks of the first system is limited, as a result of which the length of the selection gates is very small. The memory cells are very compact. As the conductor tracks are comparatively wide close to the top end, their cross-section exceeds that of the conductor tracks of the second system formed by means of the known method. As a result, the tracks have a smaller electric resistance. A top layer of a properly conductive silicide will also have a larger cross-section and hence exert a more favorable influence on the electric resistance.

The electric resistance of the conductor tracks of the second system of conductor tracks, which form the selection lines of the memory, is further reduced if on the structure thus formed, comprising said two systems of conductor tracks, there is deposited a layer of an insulating material on which a metallization is formed comprising metal strips which extend parallel to the conductor tracks of the second system of conductor tracks and are connected thereto via contact windows formed in the insulating layer. The selection lines are thus shunted by the metal strips provided on the layer of insulating material.

Preferably, the contact windows, via which the metallization present on the insulating layer is connected to the conductor tracks of the second system of conductor tracks, are formed in the insulating layer above field isolation regions. As a result, the contacts will be formed next to the selection gates, not above said selection gates. As will become apparent in a later part of this document, this allows the contact surfaces to be wider than the conductor tracks of the second system and, in addition, the risk that the selection transistors are damaged during the formation of the contacts is reduced.

As the contact windows in the insulating layer must be aligned with respect to the narrow conductor tracks of the second system of conductor tracks, electric contact between the selection lines and the metal tracks may be adversely affected by aligning errors. This is precluded if the strips of the etch mask, which is used for etching the conductor tracks of the second system of conductor tracks, are provided with a wider part at the location of the contact windows to be formed in the insulating layer, so that the conductor tracks of the second system are provided at said location with contact surfaces that are longer and wider than the width of these conductor tracks. The contact windows can then be aligned with respect to the contact windows in such a manner that aligning errors do not have any influence on the electric resistance between metal tracks and selection lines.

Little space is used to form the contact surfaces if the second system of conductor tracks is provided with contact surfaces one side of which coincides with a side of a conductor track and the opposite side of which extends to beyond the adjacent conductor track of the first system of conductor tracks.

The etch mask can be formed without critical photolithographic steps by depositing the layer of conductive material in two steps, in a first step of which a layer of doped polycrystalline silicon is deposited and, in a second step, a layer of undoped polycrystalline silicon is deposited thereon, after which the layer of doped polycrystalline silicon is exposed in the planarization treatment whereafter an oxidation treatment is carried out in which an oxide layer is formed on the doped polycrystalline silicon which is thicker than the oxide layer formed on the undoped polycrystalline silicon. Subsequently, the silicon oxide thus formed is subjected to an etch treatment until the layer of undoped silicon is exposed again, after which the desired etch mask is formed in the silicon oxide layer that is left on the layer of doped polycrystalline silicon. As a result, a layer of silicon oxide remains on the doped layer, which silicon oxide layer extends above and on either side of the conductor tracks of the first system of conductor tracks. A simple, non-critical etch mask can be used to form the desired etch mask in the layer of silicon oxide, which desired etch mask is used to etch the flat layer of conductive material, here the flat layer of polycrystalline silicon, in accordance with a pattern.

These and other aspects of the invention are apparent from and will be elucidated with reference to the embodiment(s) described hereinafter.

FIGS. 1 through 7 diagrammatically show, in cross-section and in a plan view, several stages in the manufacture of a part of a non-volatile memory. Figures bearing the same Figure number show the same stage in the manufacturing process; Figures bearing a Figure number without addition show a plan view, and Figures having a Figure number with additions a, b and c show, respectively, cross-sectional views taken on the lines A—A, B—B and C—C indicated in the plan views.

Figure 1:
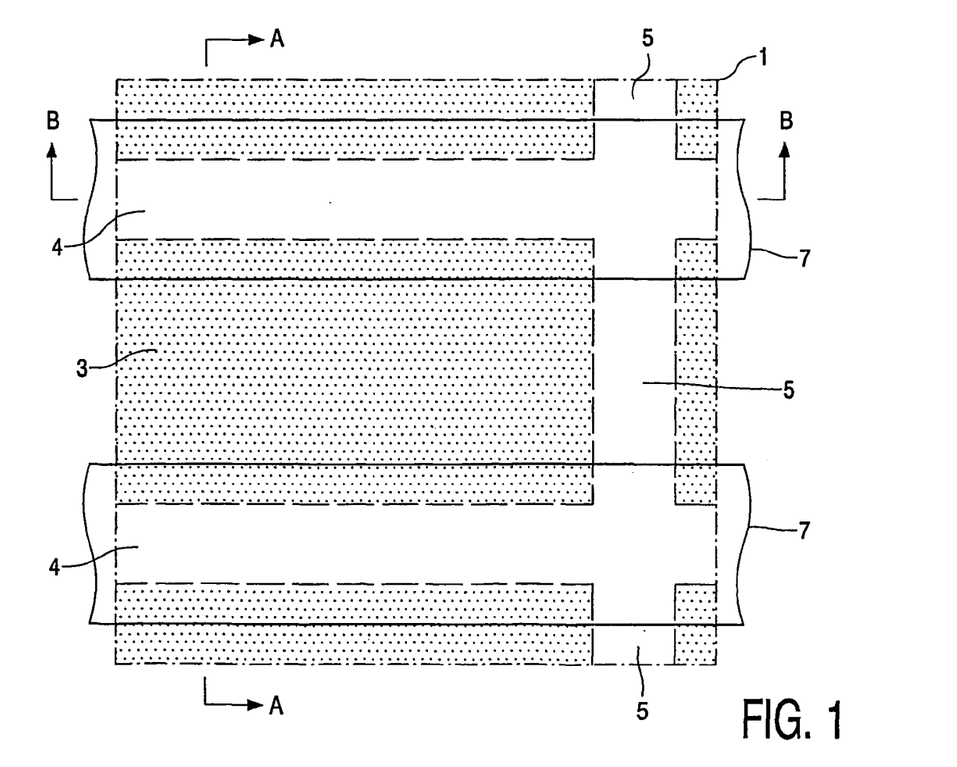
FIGS. 1 through 7 diagrammatically show, in cross-section and in a plan view, several stages in the manufacture of a part of a non-volatile memory, wherein use is made of a first embodiment of the method in accordance with the invention, FIG. 8 diagrammatically shows, in cross-section and in a plan view, a stage in the manufacture of a part of a non-volatile memory, wherein use is made of a second embodiment of the method in accordance with the invention, and FIGS. 9 through 14 diagrammatically show, in cross-section and in a plan view, several stages in the manufacture of a part of a non-volatile memory, wherein use is made of a third embodiment of the method in accordance with the invention.
Figure 1A:
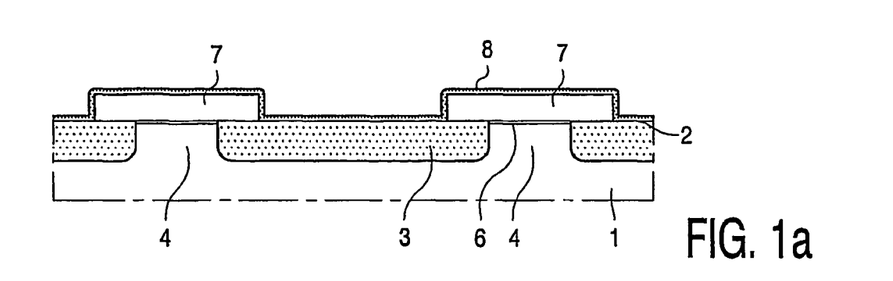
Figure 1B:
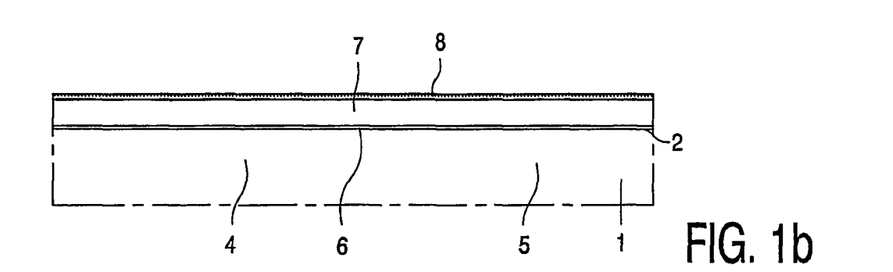

In the method, as shown in FIG. 1, parallel strip-shaped active regions 4 which are mutually isolated by field oxide 3 are formed first in a customary manner in a semiconductor body 1, here a lightly p-type doped silicon body, so as to border on a surface 2 thereof. Connection regions 5 are formed transversely to the active regions, which connection regions, as will be described at a later stage, will interconnect the sources of the selection transistors.

Subsequently, the active regions are provided with an approximately 9 nm thick layer of tunnel oxide 6 on which an approximately 200 nm thick, n-type-doped layer of polycrystalline silicon is deposited wherein the strips 7 shown in FIG. 1 are formed, which cover the active regions 4, and wherein, as will become apparent, floating gates of the memory transistors will be formed. After the formation of the strips 7, a layer of an intermediate dielectric 8 is deposited, here a layer comprising an approximately 6 nm thick layer of silicon oxide, an approximately 6 nm thick layer of silicon nitride and an approximately 6 nm thick layer of silicon oxide.

Figure 2A:
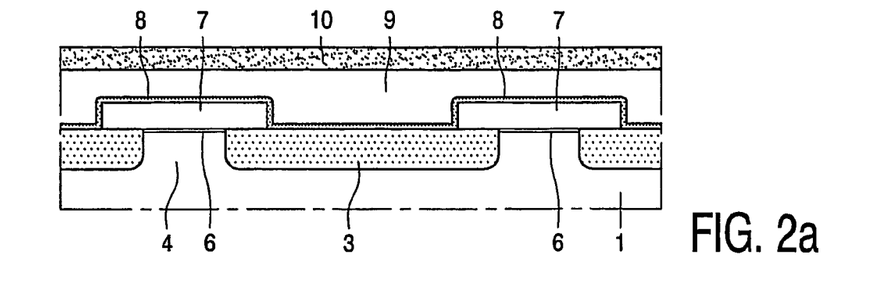
Figure 2B:
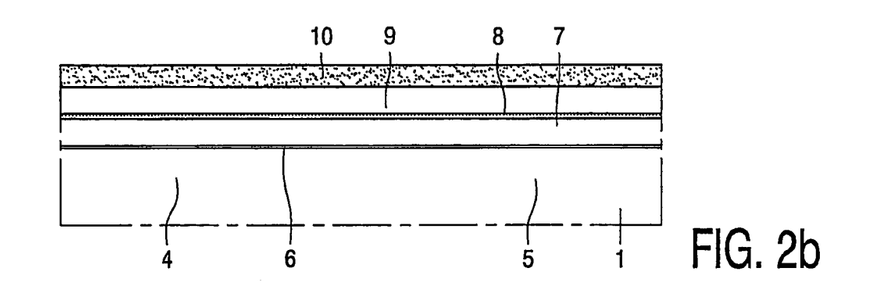
Figure 3A:
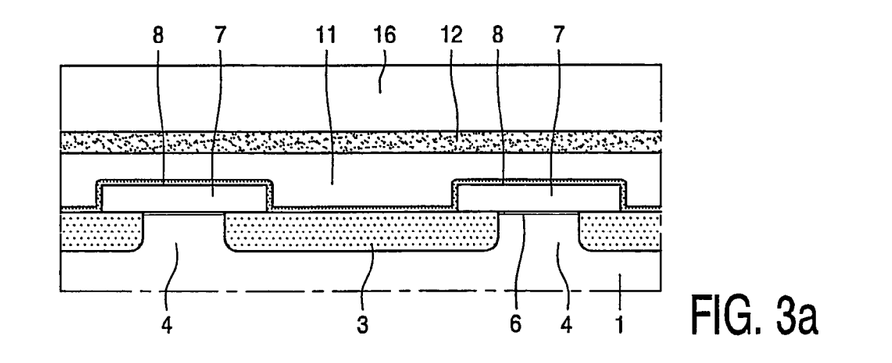
Figure 3B:
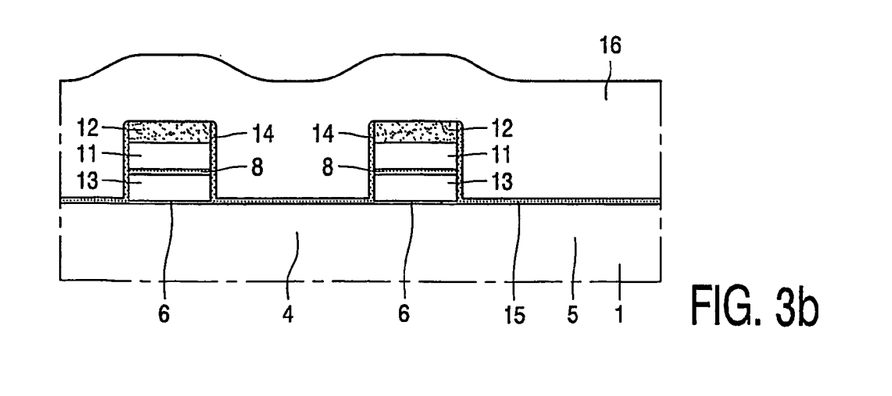

Subsequently, as shown in FIG. 2, a flat layer of n-type doped polycrystalline silicon 9 is formed on the surface 2. In practice, this layer has a substantially flat surface. The layer 9 is subsequently covered with an approximately 100 nm thick layer of silicon nitride 10. Subsequently, as shown in FIG. 3, approximately 200 nm wide conductor tracks 11 are formed in the layers 9 and 10, which conductors are covered with an insulating top layer 12. In this etch process also the strips 7 are etched, resulting in the formation of floating gates 13. Between the floating gates 13 and the conductor strips 11 there is a layer of the intermediate dielectric 8. The side walls of the conductor tracks 11 are subsequently provided with insulating layers 14 which also cover the layer of intermediate dielectric 8 and the floating gates 13. Next to the conductor tracks 11, the tunnel oxide 6 is removed and replaced by an approximately 6 nm thick layer of gate oxide 15.

The conductor tracks 11 form a first system of conductor tracks covered with an insulating layer 12, which conductor tracks extend transversely to the active regions 4 and, at the location where said conductor tracks and the active regions 4 cross each other, serve as control gates of memory transistors, and below said conductor tracks, at the location of said crossings, charge storage zones are formed, here in the form of floating gates 13 of these transistors.

Figure 4A:
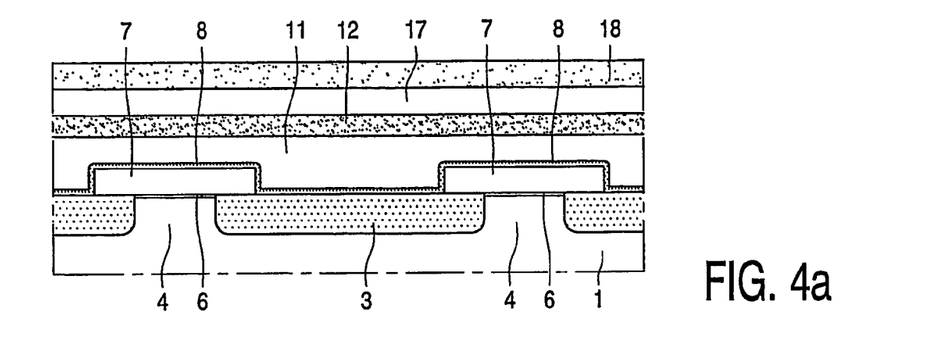
Figure 4B:
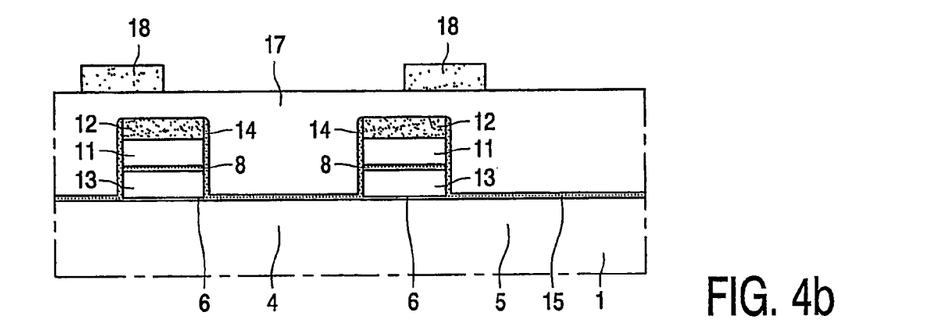
Figure 5B:
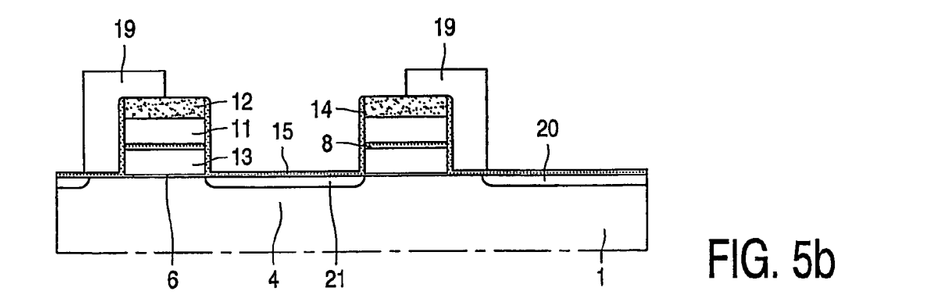
Figure 5C:
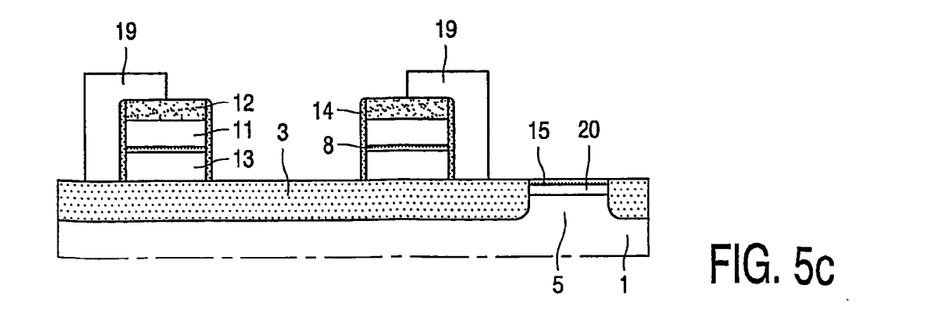
Figure 6B:
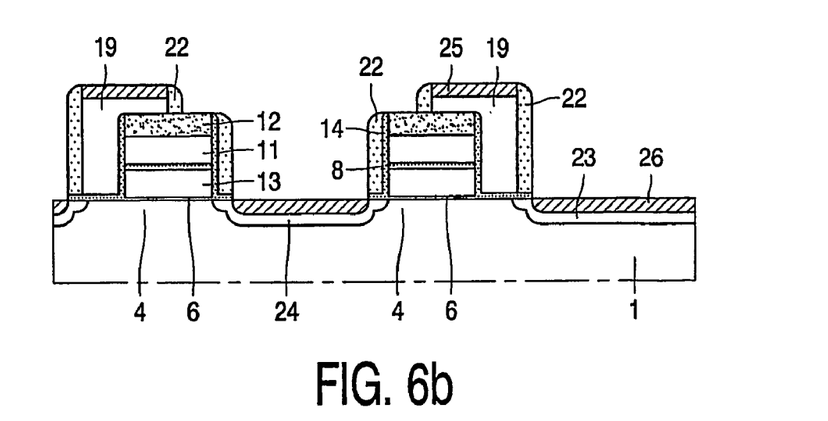
Figure 6C:
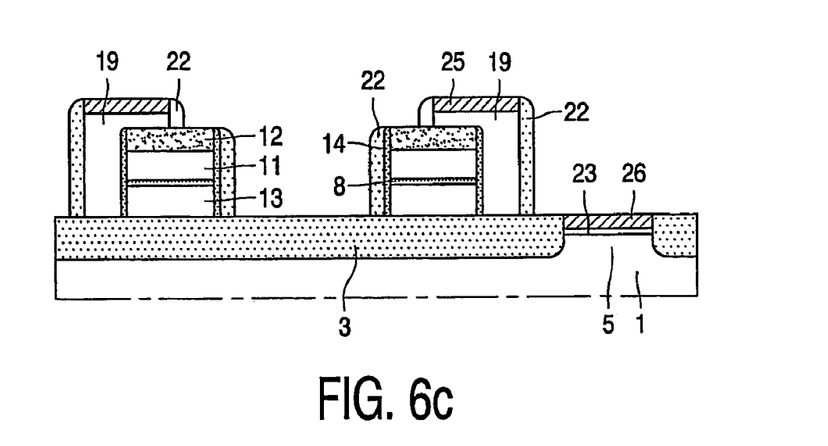

Next, as shown in FIGS. 3 and 4, a layer of a conductive material 16 is deposited which is subsequently subjected, as shown in FIG. 4, to a planarization treatment wherein the flat layer 17 is formed on which an etch mask is provided having strips 18 directed transversely to the active regions 4 and extending above and directly next to the conductor tracks 11 of the first system. Next, as shown in FIG. 5, the flat conductive layer 17 is anisotropically etched in accordance with a pattern, whereby a second system of approximately 200 nm wide conductor tracks 19 extending transversely to the active regions is formed, which conductor tracks, at the location where said conductor tracks and the active regions 4 cross each other, serve as selection gates of selection transistors, and they further serve as selection lines in the memory.

The conductive layer 16 is deposited in a thickness such that the planarization treatment results in the formation of a flat layer 17 which completely covers the insulating layer 12 present on the conductor tracks 11 of the first system of conductor tracks, so that by etching this flat conductive layer 17, a second system of conductor tracks 19 is formed which extend above the conductor tracks 11 of the first system. In this example, the thickness of the flat conductive layer 17 on the top layer 12 formed on the conductor tracks 11 is approximately 100 nm.

Using said conductor tracks 11 and 19 of the two systems of conductor tracks as a mask, comparatively lightly doped source zones 20 and drain zones 21 are formed in the semiconductor body 1 by ion implantation. Subsequently, insulating spacers 22 are formed in a customary manner on the vertical walls of the conductor tracks 11 and 19. Using the structure thus formed as a mask, the comparatively heavily doped source zones 23 and drain zones 24 are finally formed in the semiconductor body 1 by ion implantation.

The conductor tracks 19 of the second system partly overlap the conductor tracks 11 of the first system, which is the reason why their width dimension next to the tracks 11 of the first system, i.e. approximately 100 nm, is comparatively small; the selection gates thus have a very small length. The memory cells are very compact. Near the top end, however, the conductor tracks 19 are comparatively wide, i.e. approximately 200 nm, and hence have a comparatively large cross-section. As a result the tracks have a comparatively low electric resistance, so that information stored in the memory can be read comparatively rapidly. To further reduce the electric resistance, a top layer 25 of a properly conducting silicide is formed in a customary manner on the conductor tracks 19. In addition, a silicide layer 26 is formed on the source and drain zones.

Figure 7:
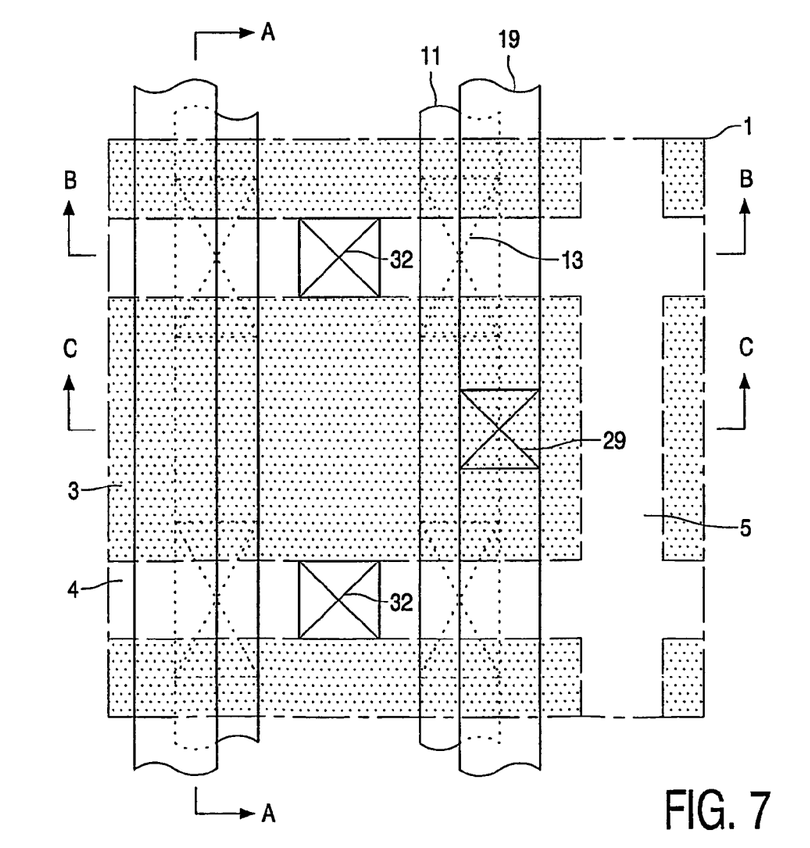
Figure 7B:
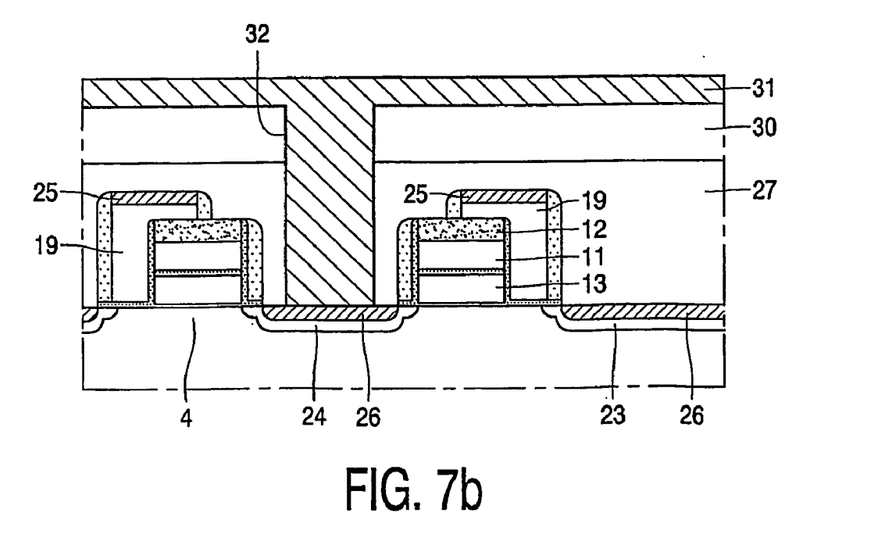
Figure 7C:
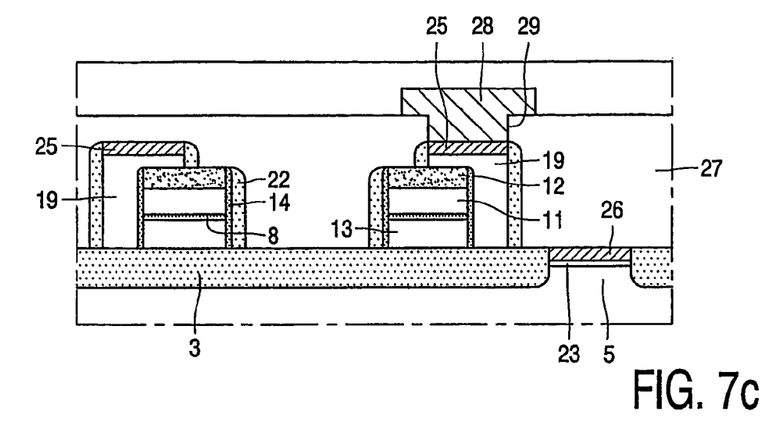

As shown in FIG. 7, on the structure thus formed comprising the conductor tracks 11 and 19 of both systems, an insulating layer 27 of silicon oxide is deposited and planarized, on which insulating layer a metallization comprising metal strips 28 is formed, which metal strips extend parallel to the conductor tracks 19 of the second system of conductor tracks and are connected thereto via contact windows 29 which are formed in the insulating layer 27. As a result, the electric resistance of the conductor tracks 19 is further reduced; they are shunted by the metal strips 28 provided on the layer of insulating material.

Furthermore, an insulating layer 30 is deposited and planarized, on which insulating layer a metallization is formed comprising metal strips 31 contacting the drain zones 24 via contact windows 32 formed in the insulating layers 30 and 27. The metal strips 31 form bit lines of the memory.

As shown in FIG. 7, the contact windows 29 are formed above field isolation regions 3. As a result, the contacts will be made next to the selection gates, not above said selection gates. As will become apparent in a later part of this document, this allows the width of the contact surfaces to exceed that of the conductor tracks 19 of the second system and, in addition, the risk of selection transistors being damaged during the formation of the contacts is reduced.

It is noted that FIG. 7 shows a plan view of a part of the non-volatile memory comprising four memory cells; said part forming a building block of a complete memory. Said complete memory comprises a large number of these building blocks which are juxtaposed in the horizontal direction as well as in the vertical direction. It is further noted that it is not necessary in practice for the metal strips 28 to be connected to the conductor tracks 19 at every location where these conductor tracks are situated above the field oxide regions 3. For example, FIG. 7 shows that there is no contact window above the conductor track 19 situated to the left of the contact window 29. In practice, the metal strips 28 are connected the to conductor tracks 19 at an interval of, for example, four memory cells.

Figure 8:
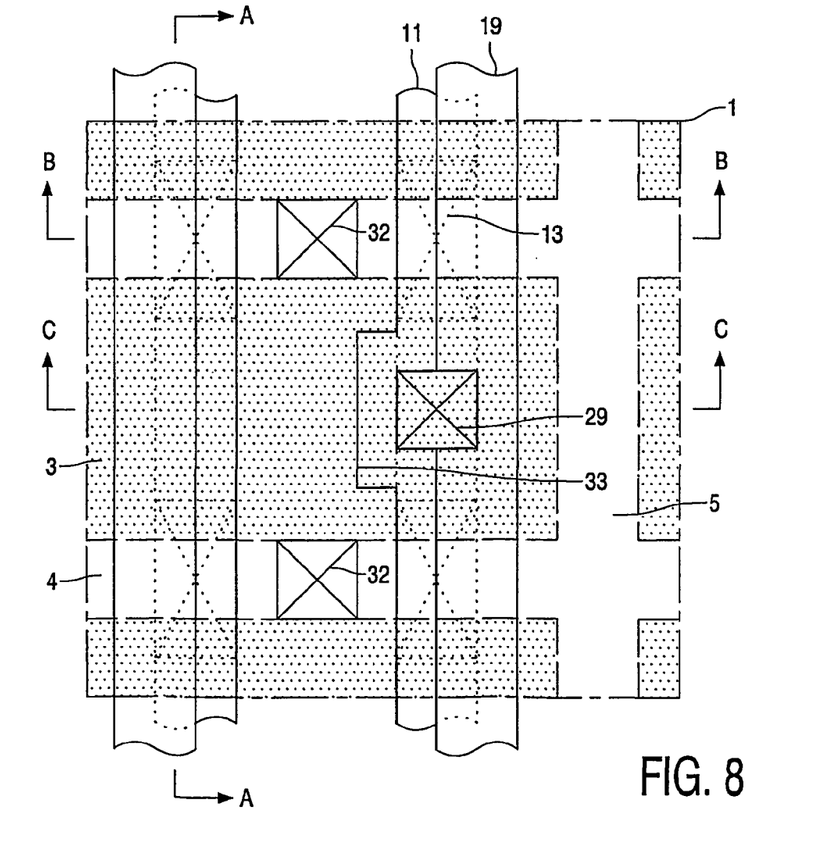
Figure 8C:
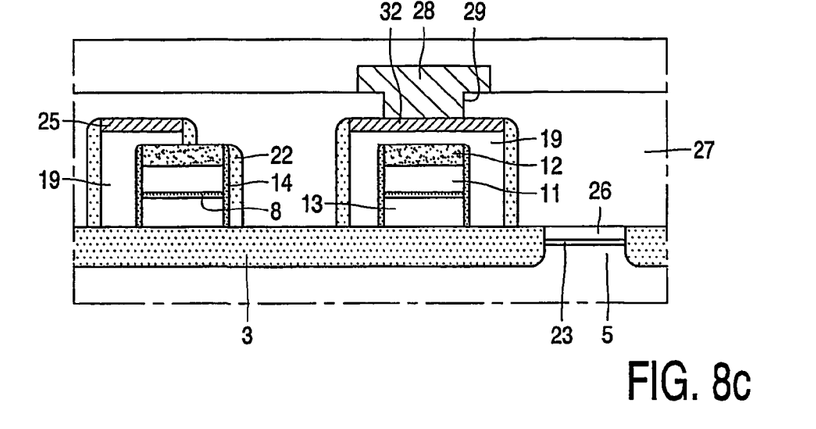
Figure 9:
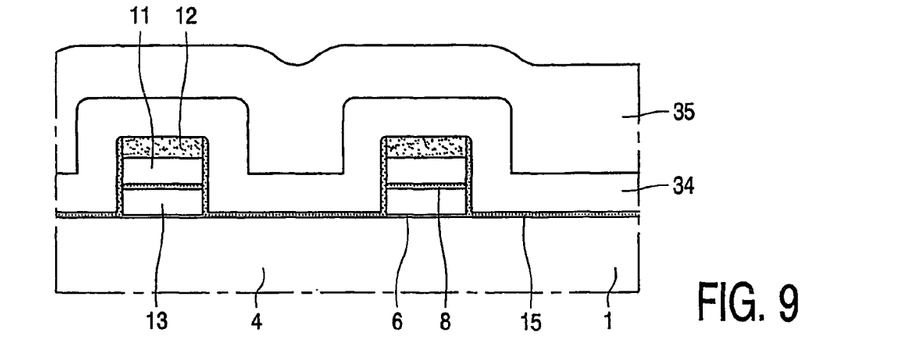

FIGS. 8c and 8 diagrammatically show, respectively, in cross section and in a plan view, a stage in the manufacture of a part of a non-volatile memory, wherein the strips 18 of the etch mask used to etch the conductor tracks 19 of the second system of conductor tracks are provided, at the location of the contact windows 29 to be formed in the insulating layer 27, with a wider part so that the conductor tracks 19, as shown in FIG. 8, of the second system are provided at said location with contact surfaces 33 which are longer and wider than these conductor tracks 19. By virtue thereof, aligning errors cannot exert influence on the electric resistance between metal tracks 19 and selection lines 19.

The formation of the contact surfaces 33 does not take up much space on the surface 2 of the semiconductor body 1 if the conductor tracks 19 are provided with contact surfaces 33 one side of which, as shown in FIG. 7, coincides with a side of a conductor track 19, and the opposite side of which extends to beyond the juxtaposed conductor track 19 of the first system of conductor tracks.

Figure 10:
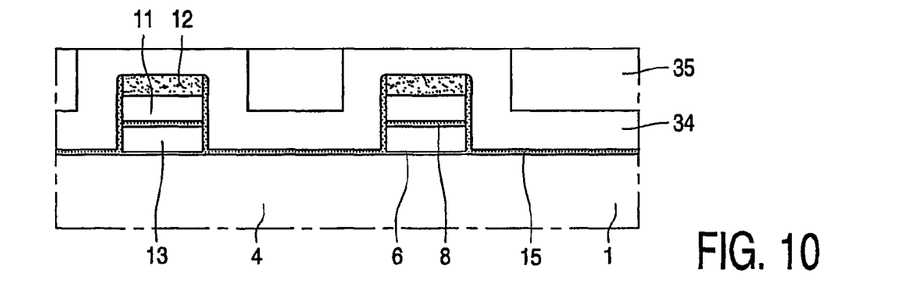
Figure 11:
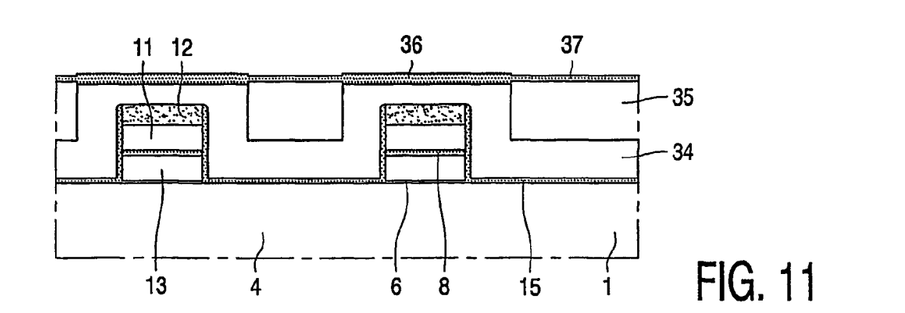
Figure 12:
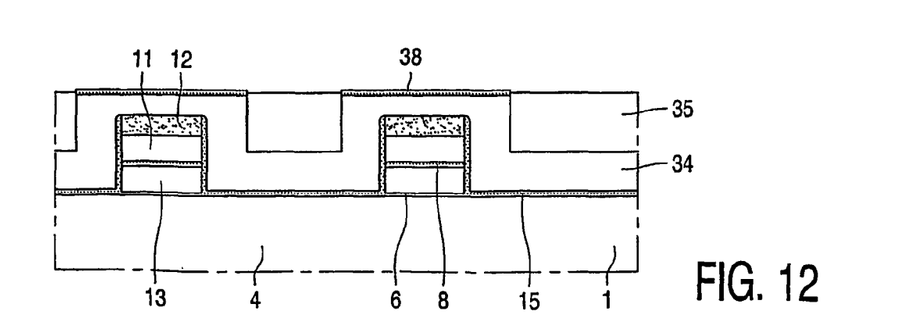
Figure 13B:
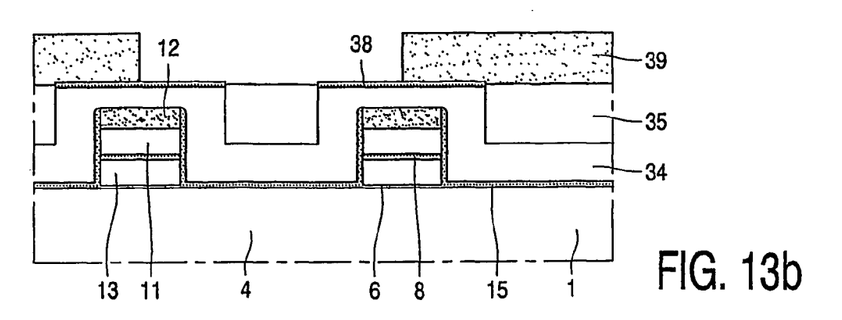
Figure 13C:
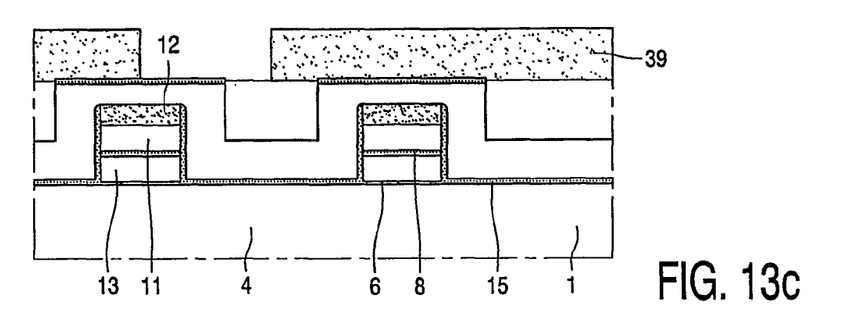
Figure 14B:
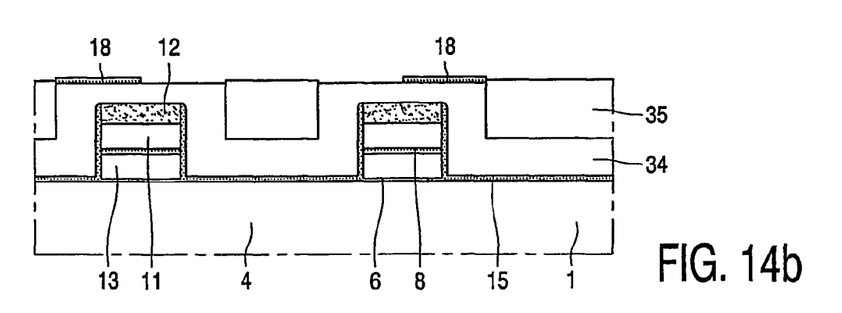
Figure 14C:
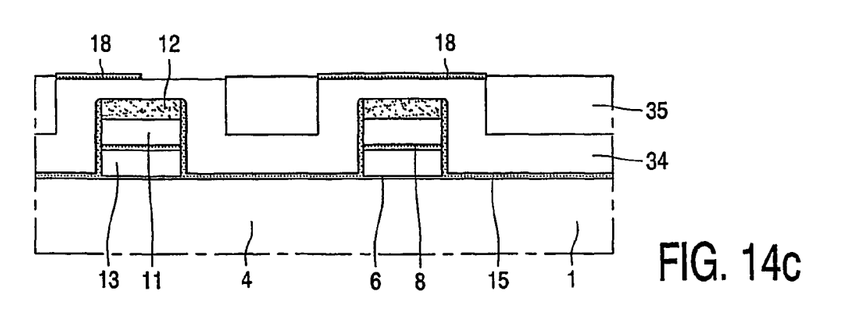

FIGS. 9 through 14 diagrammatically show, in cross-section and in a plan view, several stages in the manufacture of a part of a non-volatile memory, in which the etch mask with the strips 18 is formed without critical photolithographic steps, and in which a flat layer of conductive material is readily formed, which extends above the insulating top layer 12 of the conductor tracks 11. The layer of conductive material 16 is deposited in two steps. In a first step, a layer of doped polycrystalline silicon 34 is deposited and, in a second step, a layer of undoped polycrystalline silicon 35 is deposited thereon. In the planarization treatment, the layer of doped crystalline silicon 34 is exposed, as is shown in FIG. 10. The exposure of this layer 34 can be used as a point of detection to stop the planarization treatment The layer 34 extends above the insulating top layer 12 of the conductor tracks 11.

Subsequently, an oxidation treatment is carried out in which an oxidation layer 36 is formed on the doped polycrystalline silicon in a thickness exceeding that of the oxide layer 37 formed on the undoped polycrystalline silicon. Next, both layers of silicon oxide 36 and 37 are subjected to an etch treatment until the layer of undoped silicon is exposed again, after which the desired etch mask is formed in the layer of silicon oxide 38 left behind on the layer of doped polycrystalline silicon.

A layer of silicon oxide 38 then remains on the doped layer 34 and extends above and on either side of the conductor tracks 11 of the first system of conductor tracks. Subsequently, a non-critical etch mask 39 is provided by means of which the desired etch mask with the strips 18 is formed, which is used to etch the flat layer of conductive material, here the flat layer of polycrystalline silicon 34, in accordance with a pattern.

What is claimed is:

1. A method of manufacturing a semiconductor device comprising a non-volatile memory with memory cells comprising a memory transistor and a selection transistor, in which method parallel, strip-shaped active regions which are mutually isolated by field oxide are formed in a semiconductor body so as to border on a surface thereof, after which the surface is provided with a first system of conductor tracks which are covered with an insulating layer and directed transversely to the active regions, which conductor tracks serve as control gates of memory transistors at the location where the conductor tracks and the active regions cross each other, and below which conductor tracks, at the location where the conductor tracks and the active regions cross each other, charge storage zones of these transistors are formed, whereafter a layer of conductive material is deposited which is subsequently subjected to a planarization treatment, after which the flat conductive layer thus formed is provided with an etch mask with strips directed transversely to the active regions and extending above and directly next to the conductor tracks of the first system, after which the flat, conductive layer is anisotropically etched in accordance with a pattern, a second system of conductor tracks directed transversely to the active regions being formed which serve as a selection gate of selection transistors at the location where the conductor tracks and the active regions cross each other, characterized in that the conductive layer is deposited in a thickness such that the planarization treatment results in a flat layer which completely covers the insulating layer present on the conductor tracks of the first system of conductor tracks, so that by etching the flat, conductive layer a second system of conductor tracks is formed which extend to above the conductor tracks of the first system.

2. A method as claimed in claim 1, characterized in that on the structure thus formed, comprising said two systems of conductor tracks, there is deposited a layer of an insulating material on which a metallization is formed comprising metal strips which extend parallel to the conductor tracks of the second system of conductor tracks and are connected thereto via contact windows formed in the insulating layer.

3. A method as claimed in claim 2, characterized in that the contact windows, via which the metallization present on the insulating layer is connected to the conductor tracks of the second system of conductor tracks, are formed in the insulating layer above field isolation regions.

4. A method as claimed in claim 3, characterized in that the strips of the etch mask, which is used for etching the conductor tracks of the second system of conductor tracks, are provided with a wider part at the location of the contact windows to be formed in the insulating layer, so that the conductor tracks of the second system are provided at said location with contact surfaces.

5. A method as claimed in claim 4, characterized in that the second system of conductor tracks is provided with contact surfaces one side of which coincides with a side of a conductor track and the opposite side of which extends to beyond the adjacent conductor track of the first system of conductor tracks.

6. A method as claimed, in claim 1, characterized in that the etch mask is formed by depositing the layer of conductive material in two steps, in a first step of which a layer of doped polycrystalline silicon is deposited and, in a second step, a layer of undoped polycrystalline silicon is deposited thereon, after which the layer of doped polycrystalline silicon is exposed in the planarization treatment, whereafter an oxidation treatment is carried out after which the silicon oxide thus formed is subjected to an etch treatment until the layer of undoped polycrystalline silicon is exposed again, whereafter the desired etch mask is formed in the silicon oxide layer remaining on the layer of doped polycrystalline silicon.

* * * * *